US006855486B1

(12) United States Patent
Finders et al.

(10) Patent No.: US 6,855,486 B1
(45) Date of Patent: Feb. 15, 2005

(54) LITHOGRAPHIC METHOD AND APPARATUS

(75) Inventors: Jozef M Finders, Veldhoven (NL); Johannes J Baselmans, Oirschot (NL); Donis G Flagello, Scottsdale, AZ (US); Igor P Bouchoms, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/671,802

(22) Filed: Sep. 28, 2000

(30) Foreign Application Priority Data

| Sep. 29, 1999 | (EP) | 99307686 |
|---|---|---|
| Nov. 7, 1999 | (EP) | 99203704 |
| Jan. 18, 2000 | (EP) | 00200184 |

(51) Int. Cl.⁷ .............................................. G03B 27/42

(52) U.S. Cl. ....................... 430/394; 430/322; 430/396; 430/311; 430/5; 355/53; 355/71

(58) Field of Search ................................ 430/394, 322, 430/311, 5, 396; 355/53, 71

(56) References Cited

U.S. PATENT DOCUMENTS

| 3,492,635 | A | 1/1970 | Farr | 340/15.5 |
|---|---|---|---|---|
| 3,639,039 | A | 2/1972 | Rhodes, Jr. | 350/162 SF |
| 3,658,420 | A | 4/1972 | Axelrod | 356/71 |
| 3,729,252 | A | 4/1973 | Nelson | 350/162 |
| 3,770,340 | A | 11/1973 | Cronin et al. | 350/162 |
| 3,776,633 | A | 12/1973 | Frosch et al. | 355/132 |
| 4,241,389 | A | 12/1980 | Heimer | 362/297 |
| 4,291,938 | A | 9/1981 | Wagner | 350/91 |
| 4,370,026 | A | 1/1983 | Dubroeucq et al. | 350/163 |
| 4,472,023 | A | 9/1984 | Yamamoto | 350/162.11 |
| 4,497,015 | A | 1/1985 | Konno et al. | 362/248 |
| 4,604,345 | A | 8/1986 | Amemiya | 430/394 |
| 4,619,508 | A | 10/1986 | Shibuya et al. | 353/122 |
| 4,780,747 | A | 10/1988 | Suzuki et al. | 355/68 |
| 4,789,222 | A | 12/1988 | Ota et al. | 350/167 |
| 4,814,829 | A | 3/1989 | Kosugi et al. | 355/43 |
| 4,841,341 | A | 6/1989 | Ogawa et al. | 355/43 |
| 4,851,882 | A | 7/1989 | Takahashi et al. | 355/46 |
| 4,854,669 | A | 8/1989 | Birnbach et al. | 350/162.12 |
| 4,931,830 | A | 6/1990 | Suwa et al. | 355/71 |
| 4,936,665 | A | 6/1990 | Whitney | 350/451 |
| 4,939,630 | A | 7/1990 | Kikuchi et al. | 362/268 |
| 4,947,413 | A | 8/1990 | Jewell et al. | 378/34 |
| 4,970,546 | A | 11/1990 | Suzuki et al. | 355/53 |
| 4,988,188 | A | 1/1991 | Ohta | 353/122 |
| 5,004,348 | A | 4/1991 | Magome | 356/401 |
| 5,153,773 | A | 10/1992 | Muraki et al. | 359/619 |
| 5,191,374 | A | 3/1993 | Hazama et al. | 355/43 |
| 5,337,097 | A | 8/1994 | Suzuki et al. | 353/101 |
| 5,424,154 | A | 6/1995 | Borodovsky | 430/5 |
| 5,476,736 | A | * 12/1995 | Tanabe | 430/22 |
| 5,517,279 | A | 5/1996 | Hugle et al. | 355/46 |
| 5,563,012 | A | 10/1996 | Neisser | 430/22 |
| 5,598,250 | A | 1/1997 | Bae | 355/67 |
| 5,659,409 | A | 8/1997 | Ooi et al. | 349/10 |
| 5,675,401 | A | 10/1997 | Wangler et al. | 355/67 |

(List continued on next page.)

FOREIGN PATENT DOCUMENTS

| DE | 4421053 A1 | 12/1995 |
|---|---|---|
| EP | 0 011 709 A2 | 10/1979 |
| EP | 0 564 264 A1 | 10/1993 |
| EP | 0 687 956 A1 | 5/1995 |
| EP | 0 747772 A1 | 4/1996 |
| EP | 0794 462 A2 | 9/1997 |
| EP | A 0 915 384 | 5/1999 |
| EP | A 0 939 343 | 9/1999 |
| JP | 61-91662 A | 5/1986 |
| WO | WO 92/03842 | 3/1992 |
| WO | WO 97/33205 | 9/1997 |
| WO | WO 98/28665 | 7/1998 |
| WO | WO 98/40791 | 9/1998 |

OTHER PUBLICATIONS

Taiwanese Patent Office Search Report re: Taiwan patent Appl. No. 88105528 dated Feb. 11, 2000.
European Search Report re: EP 99 302613, dated Jul. 13, 2001.
Revocation of EP–B–0500393 to Canon Kabushiki Kaisha—May 26, 2000.
Cronin et al., "Dynamic Coherent Optical System," Optical Engineering, Mar./Apr. 1973, vol. 12, No. 2, pp. 50–55.
Reynolds, "A concept for a High Resolution Optical Lithographic System for Producing One–Half Micron Linewidths," Optical Microlithography V (1986) SPIE vol. 633, pp. 228–238.
Yang et al, "Effect of central obscuration on image formation in projection lithography," SPIE vol. 1264 Optical/Laser Microlithography III (1990), pp. 477–485.
Pol et al., "Excimer laser based lithogaphy: a deep–ultraviolet wafer stepper for VLSI processing,", Optical Engineering, Apr. 1987, vol. 26, No. 4, pp. 311–318.
Berry, "Pattern recognition automatic fine alignment," reprinted from Optical Microlithography—Technology for the Mid–1980s, Proc. SPIE Vo. 334, pp. 10–16 (1982).
Fehrs et al, "Illuminator Modification of an Optical Aligner,", KTI Microelectronics Seminar, Proceedings, Nov. 6–7, 1989, San Diego, CA. pp. 217–230.

Primary Examiner—John A. McPherson
Assistant Examiner—Daborah Chacko-Davis
(74) Attorney, Agent, or Firm—Pillsbury Winthrop LLP

(57) ABSTRACT

A method of imaging a pattern in a microlithographic exposure apparatus includes performing two exposures, each with a different mask, the superposition of the images defined by the two masks produces the complete circuit pattern. A dipolar illumination mode is used for each exposure, the dipoles of the two exposures being mutually perpendicular. The dipolar illumination mode of the first exposure is used to image mask features parallel to a first direction, and the dipolar illumination mode of the second exposure is used to image mask features perpendicular to the first direction.

19 Claims, 5 Drawing Sheets

U.S. PATENT DOCUMENTS

| | | | |
|---|---|---|---|
| 5,712,698 A | 1/1998 | Poschenrieder | 355/71 |
| 5,742,376 A | 4/1998 | Makinouchi | 355/53 |
| 5,821,034 A * | 10/1998 | Kim et al. | 430/311 |
| 6,016,187 A | 1/2000 | Noguchi et al. | 355/53 |
| 6,049,374 A | 4/2000 | Komatsuda | 355/67 |
| 6,084,655 A | 7/2000 | Suzuki et al. | 355/53 |
| 6,128,068 A | 10/2000 | Suzuki et al. | 355/53 |
| 6,211,944 B1 | 4/2001 | Shiraishi | 355/53 |
| 6,233,041 B1 | 5/2001 | Shiraishi | 355/53 |
| 6,252,647 B1 | 6/2001 | Shiraishi | 355/53 |
| 6,259,512 B1 | 7/2001 | Mizouchi | 355/67 |
| 6,263,099 B1 * | 7/2001 | Maeda et al. | 382/149 |
| 6,271,909 B1 | 8/2001 | Suzuki et al. | 355/53 |
| 6,285,443 B1 | 9/2001 | Wangler et al. | 355/67 |
| 6,285,855 B1 | 9/2001 | Tsuji | 399/618 |
| 6,387,596 B2 * | 5/2002 | Cole et al. | 430/311 |
| 6,452,662 B2 | 9/2002 | Mulkens et al. | 355/67 |
| 2001/0007495 A1 | 7/2001 | Suzuki et al. | 355/53 |
| 2001/0015797 A1 | 8/2001 | Suzuki et al. | 355/53 |
| 2002/0109827 A1 * | 8/2002 | Nishi | 355/53 |

* cited by examiner

LITHOGRAPHIC METHOD AND APPARATUS

RELATED APPLICATIONS

This application claims the benefit of priority to European Patent Application Nos. 99307686.8, filed Sep. 29, 1999, 99203704.4, filed Nov. 7, 1999, and 00200184.0, filed Jan. 18, 2000, the contents of which are herein incorporated by reference.

BACKGROUND OF THE INVENTION

1. Field of the Invention

The present invention relates to a method and apparatus for microlithographic exposure, and more particularly, to the application of such a method in a lithographic projection apparatus.

2. Discussion of Related Art

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO98/28665 and WO98/40791, incorporated herein by reference.

Lithographic projection apparatuses can be used, for example, in the manufacture of integrated circuits (ICs). In such a case, the mask (reticle) may contain a circuit pattern corresponding to an individual layer of the IC, and this pattern can then be imaged onto a target portion (comprising one or more dies) on a substrate (silicon wafer) which has been coated with a layer of photosensitive material (resist). In general, a single wafer will contain a whole network of adjacent target portions which are successively irradiated through the reticle, one at a time. In one type of lithographic projection apparatus, each target portion is irradiated by exposing the entire reticle pattern onto the target portion in one go; such an apparatus is commonly referred to as a waferstepper. In an alternative apparatus—which is commonly referred to as a step-and-scan apparatus—each target portion is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO97/33205, incorporated herein by reference.

In one form of microlithography, a mask defining features is illuminated with radiation from an effective source having an intensity distribution at a pupil plane corresponding to a particular illumination mode. An image of the illuminated mask is projected onto a resist-coated semiconductor wafer.

Problems with the prior art include that in the semiconductor manufacturing industry there is increasing demand for ever-smaller features and increased density of features. In other words the critical dimensions (CDs) are rapidly decreasing and are becoming very close to the theoretical resolution limit of state-of-the-art exposure tools such as steppers and scanners as described above. One solution to this problem is to upgrade the optics of the machine or indeed replace the entire machine. A second possibility is to use masks which include so-called "assisting features". These are features smaller than the resolution limit of the exposure tool so that they will not print on the wafer, but their presence near features to be imaged produces diffraction effects which can improve contrast and sharpen fine features. A third possibility is to use complementary Phase Shift Masks where the definition of features such as lines and spaces is established by correspondingly phase shifting the electric field amplitude 180 degrees (rather than by correspondingly modulating the amplitude of the electric field as is the case in commonly used binary chromium masks). This has the effect that the energy of the light diffracted at the mask pattern is angularly distributed in such a manner that image contrast and depth of focus are improved for imaging of lines and spaces at resolution limit. However, none of these methods is entirely satisfactory and they can also prove expensive.

BRIEF SUMMARY OF THE INVENTION

It is an object of the present invention to alleviate, at least partially, at least some of the above problems.

Accordingly, the present invention provides a method of imaging a pattern onto a substrate provided with a layer of energy-sensitive material, comprising the steps of:

performing a first exposure to image partly said pattern;

performing a second exposure to image partly said pattern, wherein at least one of said first and second exposures is performed using an illumination mode having a substantially dipolar intensity distribution.

The method of the invention enables lithography to be performed with reduced feature size and/or improved processing parameters such as exposure latitude, Mask Error Factor (MEF), depth of focus and proximity effects, without having to use improved optics and/or diffraction-assisted masks.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the method and apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the term "reticle", "wafer" or "die" in this text should be considered as being replaced by the more general terms "mask", "substrate" and "target area", respectively.

BRIEF DESCRIPTION OF THE DRAWINGS

Embodiments of the invention will now be described, by way of example only, with reference to the accompanying drawings in which.

DETAILED DESCRIPTION OF THE PREFERRED EMBODIMENTS

In the Figures, like reference symbols refer to like parts.
Embodiment 1

In optical lithography it is known to use off-axis illumination, which enables smaller features to be successfully imaged. With this technique, the mask is illuminated at non-perpendicular angles, which in particular improves the process latitude by increasing the depth of focus and/or contrast.

Figure 1:
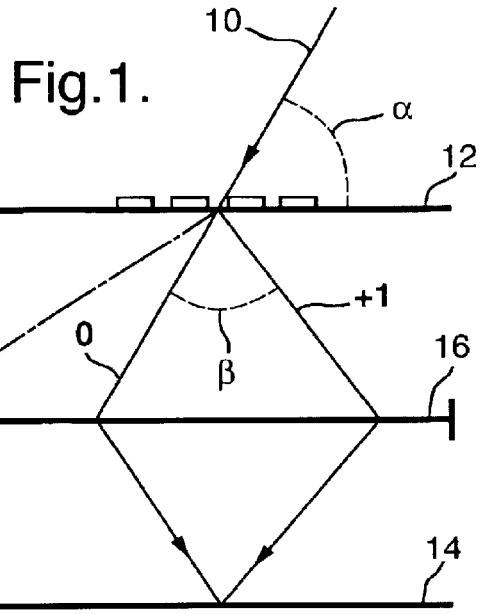
FIG. 1 illustrates the principle of off-axis illumination.

FIG. 1 illustrates this principle in which a beam of radiation 10 is incident on a mask 12 at an angle 90°-α inclined to the optical axis, which is conventionally vertical. The incident beam 10 is diffracted by the features on the mask 12 which are to be imaged on the wafer 14. The zeroth and two first-order-diffracted beams (0, ±1) are shown in FIG. 1. Improved performance can be achieved when, for example, at least part of the zeroth order and one of the first orders, which are coherent, are captured by the projection lens 16 and used to form the image on the wafer 14.

The smaller the pitch of features on the mask 12 the larger the diffraction angle β will be. If the size of the features decreases and/or their density increases too much there will come a point at which the pupil of the projection lens system 16 can no longer capture more than one diffracted order. In a practical system there will be a range of opening angles α which determines the partial coherence of the light source and thus is very important to the figures of merit of the device, such as exposure latitude, depth of focus and proximity effects. The distribution of opening angles a can be visualized by considering the intensity distribution of the radiation source or equivalently the intensity distribution in the plane of the pupil of the projection lens system (and only looking at the zero order diffracted radiation or in the absence of mask features).

FIGS. 2(a)–2(d) show examples of different illumination mode intensity distributions (or pupil filling at the projection lens). The shaded areas indicate regions of significant radiation intensity. The distance from the center of the pupil is related to the angle of incidence α.

Figure 2A:
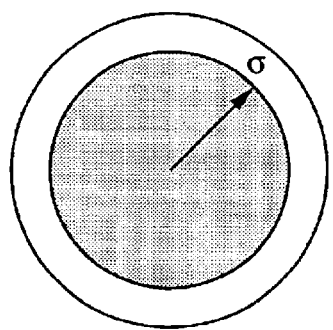
FIGS. 2(a) to 2(d) illustrate schematically the intensity distributions of different illumination modes.

FIG. 2(a) illustrates a simple illumination mode characterized by the parameter σ shown by the arrow in the Figure. Values of σ are conventionally quoted as the ratio of the radius of the illumination intensity disc to the radius of the pupil and therefore take a value between 0 and 1.

Figure 2B:
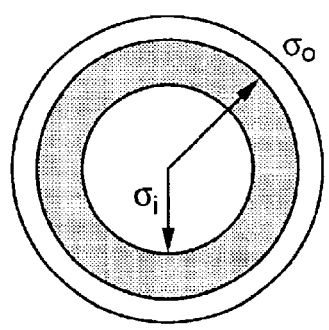

FIG. 2(b) shows an annular illumination mode in which the intensity distribution of the source is confined to an annulus to limit the range of angles of incidence in the off-axis illumination, it being remembered that the spatial intensity distribution at the pupil plane is related to the angular distribution at the mask plane. The annulus is characterized by the values $\sigma_i$ and $\sigma_o$, which are the ratios of its inner and outer radii to the radius of the pupil.

Figure 2C:
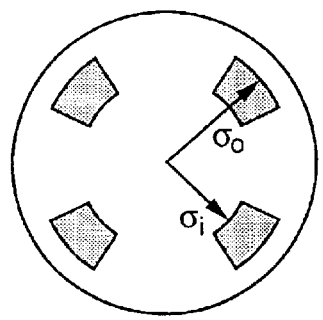

FIG. 2(c) illustrates the intensity distribution of a quadrupole illumination mode, the use of which generally gives superior imaging results to the use of annular or disc modes. Conventionally. in using such a quadrupole configuration, it is assumed that the mask pattern to be projected is comprised of orthogonal lines along x and y axes and the illumination is oriented such that each of the four poles is situated in a respective one of the four quadrants defined by these x and y axes and their point of intersection.

However, it has been found that superior performance can be obtained using dipolar illumination modes and this fact is utilized in the present invention.

Figure 2D:
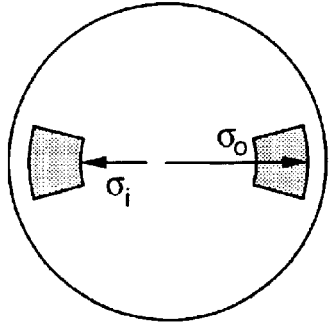

FIG. 2(d) shows an example of the illumination intensity distribution for a dipole mode. The two poles of this mode are located off the optical axis of the imaging system. For the following explanation, the two poles illustrated in FIG. 2(d) will be said to lie along the x axis and will be optimal for imaging lines parallel to the y axis, i.e. perpendicular to the axis joining the two poles (sometimes the x and y axes are referred to as horizontal and vertical respectively, but these terms typically do not bear any relation to the orientation of the machine).

Figure 3:
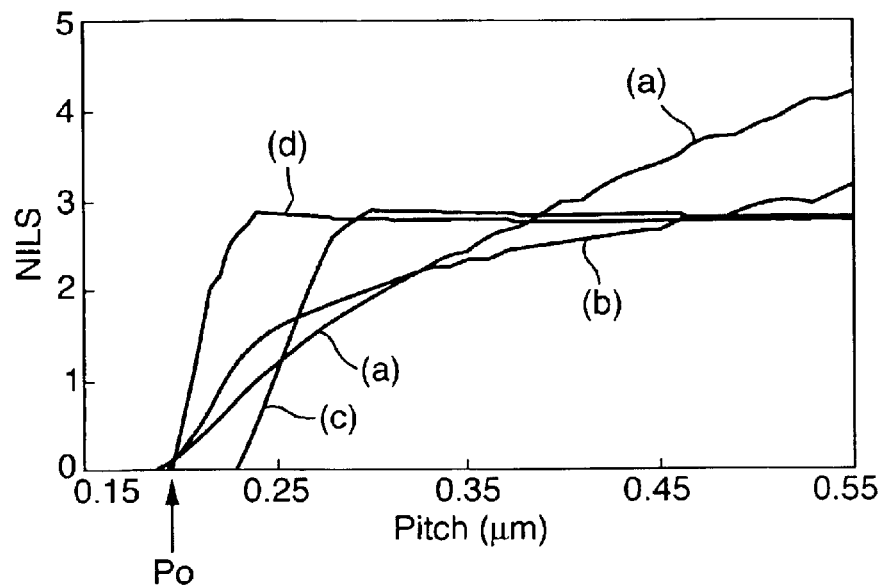
FIG. 3 shows the results of calculations related to the exposure latitude for different illumination modes.

FIG. 3 shows the results of calculations of the Normalized Image Log Slope (NILS), a good indicator of the exposure latitude, for each of the four illumination modes shown in FIGS. 2(a) to (d) for a range of different pitches of linear features in the y direction. In the graph of FIG. 3, the lines labeled a, b, c, and d correspond to the illumination modes of FIGS. 2(a) to (d) respectively. Each calculation assumes a numerical aperture (NA) of 0.7 (NA=0.7), for the conventional mode a value of σ=0.85, and for the annular (b), quadrupolar (c) and dipolar (d) modes values $\sigma_o$=0.85 and $\sigma_i$0.55.

From FIG. 3 it is clear that the simulated NILS (measure for exposure latitude) for dipole illumination (d) is significantly greater than that of the other illumination modes for pitches close to the resolution limit $P_0$.

Figure 4:
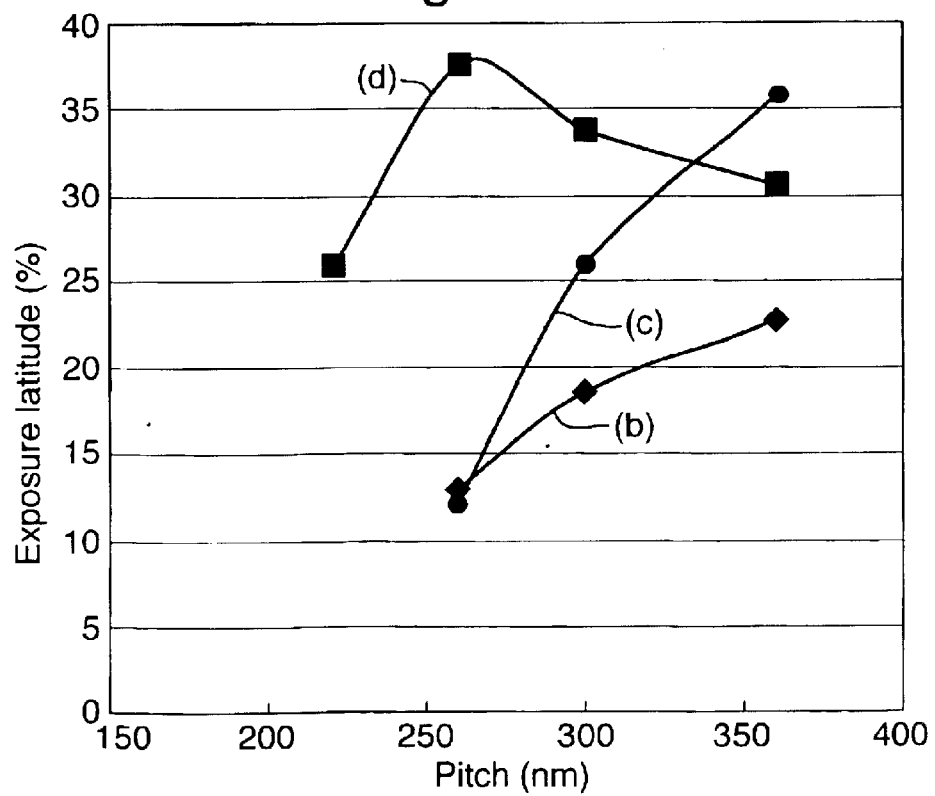
FIG. 4 is a graph showing experimental results of exposure latitude determinations for different illumination modes.

FIG. 4 illustrates the experimentally observed exposure latitude at different pitches for the following illumination modes: annular (b), quadrupolar (c), and dipolar (d) respectively. The numerical aperture and σ values were the same as those for the simulation illustrated in FIG. 3. In FIG. 4 the same trends are observed as in FIG. 3 and clearly for pitches close to the resolution limit a dipole illumination mode (d) exhibits superior exposure latitudes.

A further advantage of dipole illumination is that it provides a depth of focus, when operating close to the resolution limit, that is superior to the depth of focus that can be obtained with quadrupolar illumination. For 1:1 dense lines, the optimum depth of focus is achieved for quadrupolar illumination when:

$$\sigma_{centre} = \frac{1}{LW}\left(\frac{\lambda}{NA}\right)\frac{\sqrt{2}}{4}$$

and for dipole illumination when:

$$\sigma_{centre} = \frac{1}{LW}\left(\frac{\lambda}{NA}\right)\frac{1}{4}$$

where $\sigma_{centre}=(\sigma_o+\sigma_i)/2$, NA=numerical aperture, λ=wavelength and LW=line width.

Close to the resolution limit, the resolvable line width LW, is given by $$LW_r = \left(\frac{\lambda}{NA}\right)\frac{1}{4}.$$

When this is substituted above, it can be seen that, for quadrupolar illumination, a value of $\sigma_{centre}$ larger than 1 is required to obtain maximum depth of focus; however, since values of $\sigma_{centre}$ greater than 1 are physically impossible, dipole illumination modes are preferred for maximum depth of focus for structure sizes close to the resolution limit.

Embodiment 2

A preferred embodiment of the method of the invention is to perform two exposures using two respective perpendicular dipole patterns. The first exposure is used to image mask features parallel to a first direction, and the second exposure using the other dipole illumination mode is used to image mask features perpendicular to the first direction.

In one particular embodiment, two distinct masks are used, one for each of the exposures, and the superposition of the images of the two masks produces a single circuit pattern. As well as changing between mutually perpendicular dipolar illumination modes and changing masks between the first and second exposures it is possible to select independently the specific parameters of the dipole illumination mode for each exposure, such as $\sigma_o$ and $\sigma_i$ and so on, in order to optimize the exposure for the structure sizes parallel and perpendicular to the first direction.

In an alternative embodiment, a single mask is used, but the said mask contains two different sub-patterns; one of these sub-patterns is then used for the first exposure referred to above, whereas the second sub-pattern is used for the second exposure referred to above.

According to the methods described above, two dipolar illumination modes are used for consecutive exposures. However, this does not necessarily have to be the case. Typically, one dipolar illumination mode would be used to image the most critical features of the pattern in one direction and the other exposure could be performed using a quadrupolar, annular or conventional (disc) illumination mode to fill in the remaining structures. The order of the two exposures may, of course, be reversed and indeed more than two exposures could be used to build up the single pattern, provided that one of them uses a dipolar illumination mode.

In its simplest form, for imaging horizontal and vertical lines only, the two masks (or two sub-patterns, in the case of a single mask with 2 sub-patterns) will define only linear features in these directions respectively. However, for more complicated mask designs, software can be used to decompose the pattern into two distinct sub-patterns. Fourier transformation of the mask pattern can be used to highlight the most critical direction, and that exposure can be performed using a dipolar illumination mode.

Embodiment 3

A further embodiment of the present invention is to use a "soft dipole" illumination mode for at least one of the dipole exposures. A soft dipole mode is particularly suited to imaging a pattern which includes some features which are not in the x or y directions; for example, diagonal or curved lines. Some examples of soft dipole illumination modes include a basic dipole intensity distribution as shown in FIG. 2(d) but with a weaker general background illumination across the pupil, or with a weaker central on-axis pole in addition to the two off-axis poles, or it may resemble a quadrupole illumination mode, but with two strong intensity poles and two weaker intensity poles.

Embodiment 4

In a particular embodiment of the invention, at least one of the dipole exposures is performed using polarized electromagnetic radiation. In a specific example, the electromagnetic radiation is linearly polarized, such that its electric field is oriented substantially perpendicular to the axis joining the two (main) poles in the dipole pattern; if that axis is then substantially perpendicular to the mask features being imaged in a particular exposure (as discussed above), the said electric field will be substantially parallel to those features. This can greatly increase the efficiency of the exposure, producing inter alia greatly increased image contrast.

In a specific embodiment, both the first and second exposure are performed using a dipole illumination mode, the features imaged in the first exposure are substantially perpendicular to those imaged in the second exposure, and the axis joining the (main) dipoles in the dipole illumination mode used for each exposure is substantially perpendicular to the features imaged in that exposure. If linearly polarized electromagnetic radiation is used for each exposure, and is polarized in each case so that its electric field is oriented perpendicular to said axis for that exposure, then both exposures are conducted using polarized radiation, and the polarization directions for both exposures are mutually perpendicular. This set-up can give particularly excellent results.

Figure 5:
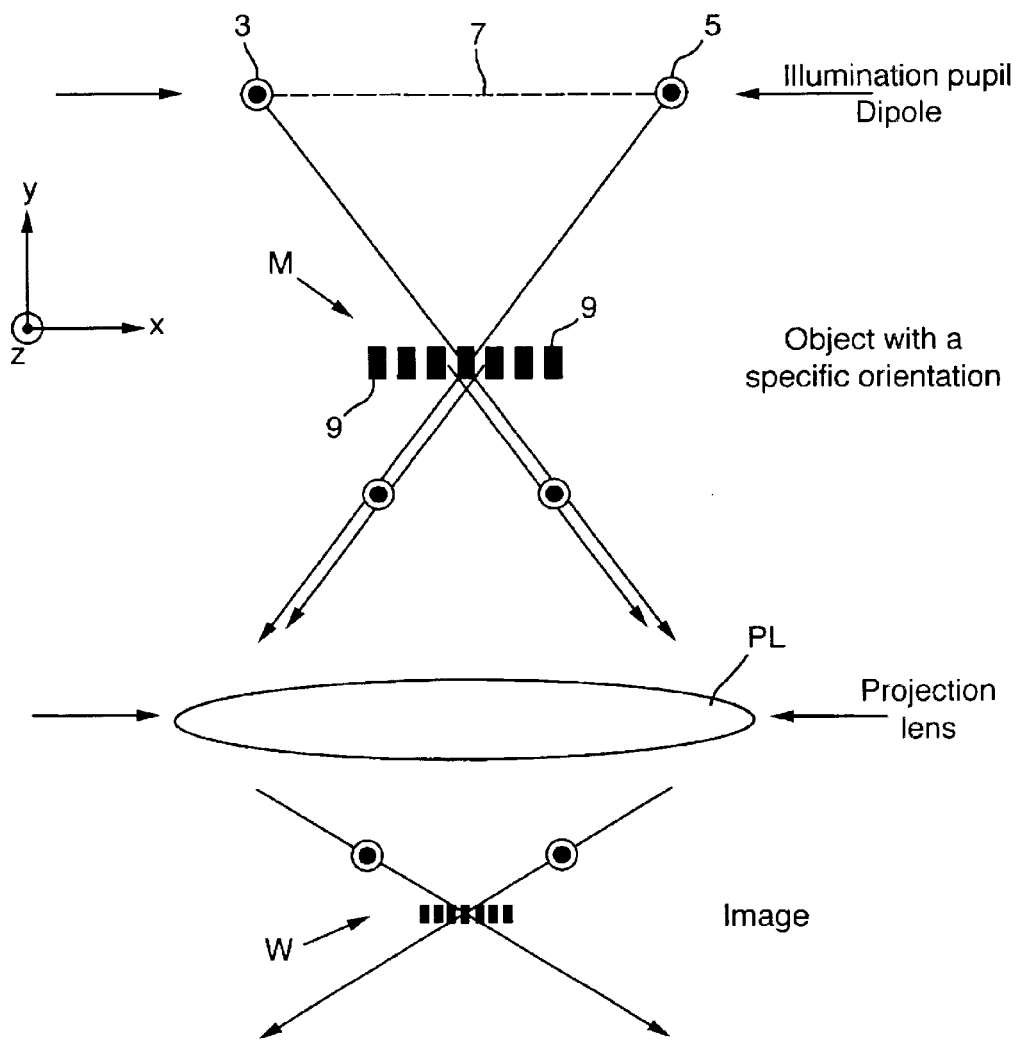
FIG. 5 shows a set-up in which linearly polarized light is used to perform at least one dipole exposure.

FIG. 5 schematically depicts the projection of an image using a dipole illumination mode. A dipole illumination pattern having two poles 3 and 5 is used to project an image of a mask pattern M through a projection system PL onto a wafer W. As here depicted, the mask pattern M contains (substantially) only features 9 extending in the z-direction (perpendicular to the plane of the Figure); these features are therefore oriented perpendicular to the axis 7 joining the two poles 3,5 (which axis 7 extends along the x-direction). Preferentially, the radiation from the illumination pattern is linearly polarized, with its E-field oriented along the z-direction, i.e. perpendicular to the axis 7 and parallel to the features 9.

The polarization mode described in the previous paragraph will here be referred to as polarization mode A. In an alternative situation—here referred to as polarization mode B—the E-field of the illumination radiation is oriented along the x-direction, i.e. parallel to the axis 7 and perpendicular to the features 9. This mode is not preferential in the present invention, but is described here for reference purposes with regard to FIG. 6.

Figure 6:
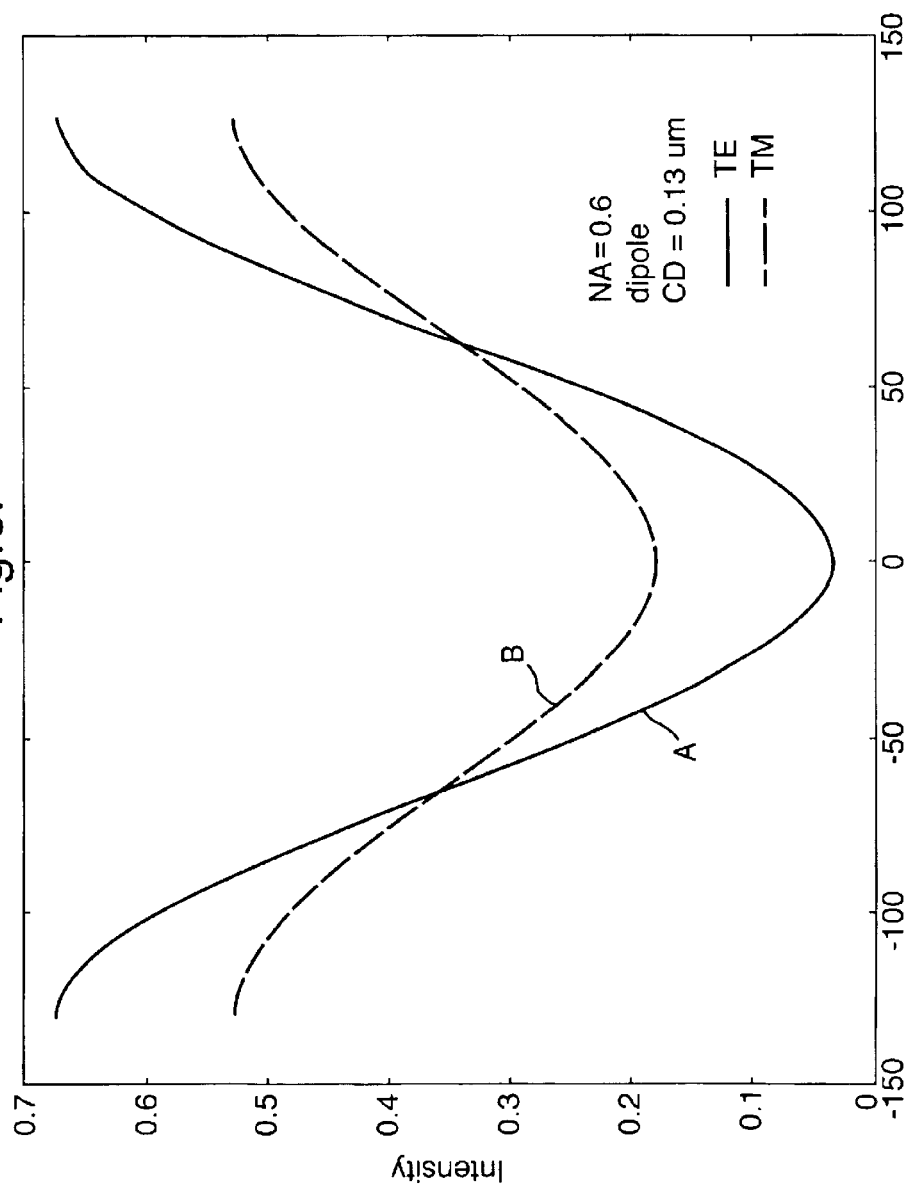
FIG. 6 shows contrast results (a plot of intensity through an image of a line) for dipole exposures performed using two different polarization orientations.

FIG. 6 shows contrast results obtained using a lithographic projection apparatus in which the projection system had a numerical aperture NA=0.6. The Figure refers to a projection wavelength of 248 nm (DUV), CD=0.13 μm and k1=0.3. The Figure shows the intensity as it would be measuerd when a point probe in the image plane is scanned in a direction perpendicular to the mask feature which is being imaged. Along the horizontal axis in FIG. 6 the position of said probe is given, in nanometers. The two curves A, B refer respectively to the polarization modes A, B described above. It is seen that polarization mode A gives dramatically better contrast than polarization mode B. Similarly, the use of polarization mode A in accordance with the invention gives greatly improved results as compared to the use of non-polarized illumination radiation.

Embodiment 5

In a particular embodiment of the invention, at least one of the dipole exposures is performed using an attenuated Phase Shift Mask, i.e. a mask 12 where the definition of the line-space features as shown in FIG. 1 is established by correspondingly phase shifting the electric field amplitude 180 degrees in combination with a corresponding and appropriately chosen amplitude attenuation of the electric field. In order to obtain optimum contrast and process latitude, said attenuation can be chosen such that the energy in the zeroth and the plus-first-order diffracted beam (0, ±1) as shown in FIG. 1 are about equal or equal. For instance, establishing a line-space definition with 0.5 duty cycle by line=0 degree phase shift with attenuation zero, space=180 degree phase shift with intensity attenuation= 0.049 (i.e. an amplitude attenuation of 0.222)

theoretically yields equal intensities in the zeroth and plus-first-order diffracted beams in FIG. 1. With this embodiment the detrimental effect of an energy difference between the zeroth and plus-first-order diffracted beams in FIG. 1, which may occur when using a mask 12 carrying a binary chromium line space pattern, is alleviated.

Embodiment 6

The projection system in a lithographic projection apparatus is generally a highly precise piece of equipment, often containing many tens of individual optical elements that are designed, machined, finished, and positioned with ultra-high accuracy. Nevertheless, even the most carefully designed projection system will generally suffer from residual optical defects, such as astigmatism, coma, curvature of field, etc. These defects cause image deterioration that can lead to the production of inferior or even rejected products by the lithographic apparatus concerned. Consequently, there is an important impetus to (at least partially) correct such aberrations. In the case of astigmatism, the current invention offers a powerful, effective and elegant solution of this problem.

By way of its very definition, the presence of astigmatism in a projection system results in different focal planes for lines oriented at different angles within an object plane perpendicular to the optical axis of the system. Stated more specifically, if an image to be projected by an astigmatic projection system contains lines extending in distinct first and second directions, which are mutually perpendicular, then the focal plane for the lines extending in the first direction will not coincide with the focal plane for the lines extending in the second direction. Therefore, if a mask pattern containing such lines is imaged onto a substrate in a single step, it will be impossible for all of its lines to be simultaneously sharply focused on the substrate; this will lead to a blurred image.

The present invention circumvents this problem by imaging a mask pattern in two distinct steps: a first step for lines extending in the said first direction, and a second step for lines extending in the said second direction. Between these two steps, it is possible to adjust the focus of the projection apparatus, e.g. by displacing or tilting the substrate table relative to the projection system, by displacing one or more optical elements in the projection system (using dedicated actuators), etc. This ensures optimal focus of the lines extending in both the first and second directions, whereby the effects of astigmatism in the projection system are suppressed.

Embodiment 7

Figure 7:
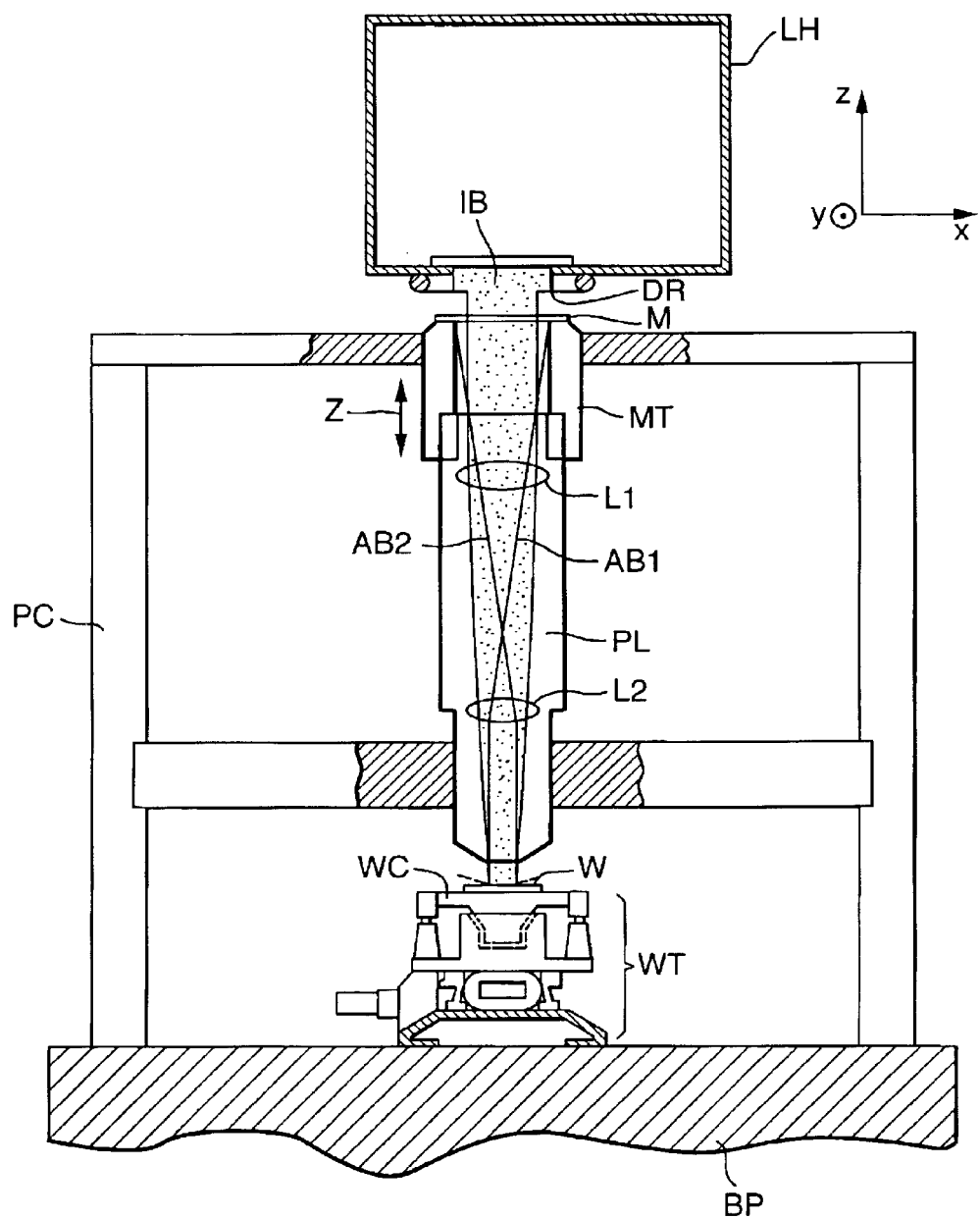
FIG. 7 shows an apparatus for imaging a pattern onto a substrate with which the present invention can be embodied.

With reference to FIG. 7, a lithographic apparatus embodying the invention will now be described for repetitive imaging of a mask M (for example a reticle) on a substrate W (for example a resist-coated wafer). The particular apparatus shown here is transmissive; however, it may also be reflective or catadioptric, for example. The apparatus comprises an illumination housing LH containing a radiation source and an illumination system for supplying an illumination beam IB. This beam passes through a diaphragm DR and is subsequently incident on the mask M that is arranged on a mask table MT. The mask table MT forms part of a projection column PC incorporating also a projection lens system PL which comprises a plurality of lens elements, only two of which, $L_1$ and $L_2$ are shown in FIG. 7. The projection lens system images the mask M onto the substrate W which is provided with a photoresist layer (not shown). The substrate is provided on a substrate support WC which forms part of a substrate table WT on, for example, air bearings. The projection lens system has, for example a magnification M=1/5, a numerical aperture NA>0.48 and a diffraction-limited image field with a diameter of, for example 22 mm. The substrate table WT is supported, for example by a granite base plate BP which closes the projection column PC at its lower side.

The substrate can be displaced in the x, y and z directions and rotated for example about the z axis with the aid of the substrate table. These adjustments are controlled by various servosystems such as a focus servosystem, for example an x, y, $\phi_z$ interferometer system cooperating with the substrate support, and an alignment system with which mask marks can be aligned with respect to substrate marks. These servosystems are not shown in FIG. 7. Only the alignment beams (with their chief rays $AB_1$, $AB_2$) of the alignment system are shown.

Each mask pattern must be imaged a number of times, in accordance with the number of ICs to be formed on the substrate, each time on a different target portion of the substrate.

The depicted apparatus can be used in two different modes:

In step mode, the mask stage MT is kept essentially stationary, and an entire mask image is projected in one go (i.e. a single "flash") onto a target portion. The substrate stage WT is then shifted in the x and/or y directions so that a different target portion can be irradiated by the beam IB.

In scan mode, essentially the same scenario applies, except that a given target portion is not exposed in a single "flash". Instead, the mask stage MT is movable in a given direction (the so-called "scan direction", e.g. the x direction) with a speed v, so that the projection beam IB is caused to scan over a mask image; concurrently, the substrate stage WT is simultaneously moved in the same or opposite direction at a speed V=Mv, in which M is the magnification of the lens PL (e.g. M=1/5). In this manner, a relatively large target portion can be exposed, without having to compromise on resolution.

These processes are repeated until all areas of the substrate have been illuminated.

The apparatus embodying the invention further comprises a changer (not shown) for exchanging first and second masks M; alternatively, in the case of a single mask M with two different mask patterns, the changer serves to move the mask so as to position either one of the said two patterns in the projection beam IB. Each target portion of the substrate must be exposed (at least) twice, once imaging a first mask (sub-pattern) and once imaging a second mask (sub-pattern). The target portions of the entire substrate can all be exposed using the first mask (sub-pattern) and then the first and second masks (or mask sub-patterns) are exchanged and all of the target portions of the substrate are exposed using the second mask (sub-pattern). Alternatively, a given target portion can be consecutively exposed using the first and second masks (or mask sub-patterns) before shifting the substrate stage to image a different target portion using the first and second masks (or mask sub-patterns).

The illumination system of the apparatus embodying the invention includes means for defining the dipole and other illumination modes. It is presently preferred that diffractive optical elements, for example Fresnel lens segments and/or computer-generated holograms, are used to generate the dipole illumination, but other means, such as an apertured plate or interposed blades could be used. Preferably the illumination system includes an axicon/zoom module and other optical components such as an optical integrator. The illumination system can switch between different illumination modes for the first and second exposures and preferably the parameters of each mode, such as $\sigma_o$ and $\sigma_i$, are independently selectable for each exposure.

Further details of such illumination systems are disclosed in EP-A-0 687 956 and EP-A-0-949 541, for example, and these references are incorporated herein by reference.

Whilst specific embodiments of the invention have been described above it will be appreciated that the invention may be practiced otherwise than described.

We claim:

1. A method of imaging a patterned structure onto a substrate provided with a layer of energy-sensitive material, comprising:

performing a first exposure to image a first pattern;

performing a second exposure to image a second pattern, wherein at least one of said first and second exposures is performed using an illumination mode having a substantially dipolar intensity distribution, and wherein at least one of said patterns which is imaged using the illumination mode having a substantially dipolar intensity distribution comprises features oriented substantially perpendicular to an axis joining respective two poles of the substantially dipolar intensity distribution.

2. A method according to claim 1, wherein the other of said first and second exposures is performed using an illumination mode having an intensity distribution which is substantially one of dipolar, quadrupolar, annular and disk-like.

3. A method according to claim 1, wherein a first mask having said first pattern is used to define an image formed by said first exposure and a second mask having said second pattern is used to define an image formed by said second exposure.

4. A method according to claim 3, further comprising exchanging masks between said first and second exposures.

5. A method according to claim 3, wherein said first mask is different from said second mask.

6. A method according to claim 1, wherein a mask having at least said first pattern and said second pattern is used for the first and second exposures, the first pattern is used to define an image formed by the first exposure and the second pattern is used to define an image formed by the second exposure.

7. A method according to claim 1, wherein said illumination mode is used to image linear features of the patterned structure oriented substantially perpendicular to an axis joining the respective two poles of said substantially dipolar intensity distribution.

8. A method according to claim 7, wherein at least one of a respective mask and a mask sub-pattern is used with said illumination mode exposure and substantially defines only features of the patterned structure oriented substantially perpendicularly to the axis joining the respective two poles of said substantially dipolar intensity distribution.

9. A method according to claim 1, wherein said illumination mode has an intensity distribution comprising two relatively intense poles and further comprising at least one of: a relatively weak central pole; two relatively weak further poles; and a general relatively weak background intensity.

10. A method according to claim 1, further comprising changing at least one of a pole radial position, size and intensity between said first and second exposures.

11. A method according to claim 1, wherein said first and second exposures are both performed using dipolar illumination modes and wherein axes of the two dipolar modes are substantially perpendicular to each other.

12. A method according to claim 1, wherein at least one of the exposures performed using an illumination mode having a substantially dipolar intensity distribution, is performed using polarized electromagnetic radiation.

13. A method according to claim 12, wherein the polarized radiation is linearly polarized.

14. A method according to claim 13, wherein the radiation is polarized to have an electric field component oriented substantially perpendicular to an axis joining the respective two poles of the substantially dipole intensity distribution.

15. A method according to claim 1, wherein between the first and second exposures, a focus of a pattern on the substrate is adjusted to ensure that both the first and second exposures are performed at a substantially optimum focus.

16. A method according to claim 1, wherein at least one of the exposures using an illumination mode having a substantially dipolar intensity distribution is performed using an attenuated phase shift mask.

17. A method according to claim 16, wherein an attenuation is chosen to balance an energy of radiation of zeroth- and first-order diffracted beams as they are emerging from said pattern and captured by a projection system used to image the patterns on the substrate.

18. A device manufacturing method comprising:

providing a substrate which is at least partially covered by a layer of energy-sensitive material;

providing at least one mask for defining a pattern; and imaging at least part of said mask pattern onto said substrate using a method according to claim 1.

19. A method of imaging a patterned structure onto a substrate provided with a layer of energy-sensitive material, comprising:

performing an exposure to image a pattern using an illumination mode having a substantially dipolar intensity distribution, wherein the pattern imaged using the illumination mode having the substantially dipolar intensity distribution comprises features oriented substantially perpendicular to an axis joining respective two poles of the substantially dipolar intensity distribution.

* * * * *